US010854733B2

(12) United States Patent
Basker et al.

(10) Patent No.: US 10,854,733 B2
(45) Date of Patent: Dec. 1, 2020

(54) COMPOSITE SPACER ENABLING UNIFORM DOPING IN RECESSED FIN DEVICES

(71) Applicant: INTERNATIONAL BUSINESS MACHINES CORPORATION, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/957,212

(22) Filed: Apr. 19, 2018

(65) Prior Publication Data

US 2018/0248017 A1 Aug. 30, 2018

Related U.S. Application Data

(60) Continuation of application No. 15/285,035, filed on Oct. 4, 2016, now Pat. No. 10,002,945, which is a
(Continued)

(51) Int. Cl.
*H01L 29/66* (2006.01)
*H01L 29/08* (2006.01)
(Continued)

(52) U.S. Cl.
CPC .. *H01L 29/66636* (2013.01); *H01L 21/02126* (2013.01); *H01L 21/02164* (2013.01);
(Continued)

(58) Field of Classification Search
None
See application file for complete search history.

(56) References Cited

U.S. PATENT DOCUMENTS 6,306,702 B1 10/2001 Hao et al.
7,365,378 B2 4/2008 Huang et al.
(Continued)

OTHER PUBLICATIONS

List of IBM Patents or Patent Applications Treated as Related dated Apr. 19, 2018, 2 pages.
(Continued)

*Primary Examiner* — Steven M Christopher
(74) *Attorney, Agent, or Firm* — Tutunjian & Bitetto, P.C.; Robert Sullivan

(57) ABSTRACT

A semiconductor device that includes at least one fin structure and a gate structure present on a channel portion of the fin structure. An epitaxial semiconductor material is present on at least one of a source region portion and a drain region portion on the fin structure. The epitaxial semiconductor material includes a first portion having a substantially conformal thickness on a lower portion of the fin structure sidewall and a second portion having a substantially diamond shape that is present on an upper surface of the source portion and drain portion of the fin structure. A spacer present on first portion of the epitaxial semiconductor material.

8 Claims, 4 Drawing Sheets

Related U.S. Application Data division of application No. 14/843,321, filed on Sep. 2, 2015, now Pat. No. 9,620,644.

(51) Int. Cl.

| | |
|---|---|
| *H01L 29/161* | (2006.01) |
| *H01L 29/16* | (2006.01) |
| *H01L 29/78* | (2006.01) |
| *H01L 21/20* | (2006.01) |
| *H01L 21/02* | (2006.01) |
| *H01L 21/225* | (2006.01) |
| *H01L 21/268* | (2006.01) |
| *H01L 21/311* | (2006.01) |
| *H01L 21/324* | (2006.01) |

(52) U.S. Cl.
CPC ...... *H01L 21/2022* (2013.01); *H01L 21/2251* (2013.01); *H01L 21/268* (2013.01); *H01L 21/31111* (2013.01); *H01L 21/31116* (2013.01); *H01L 21/324* (2013.01); *H01L 29/0847* (2013.01); *H01L 29/161* (2013.01); *H01L 29/1608* (2013.01); *H01L 29/6653* (2013.01); *H01L 29/6656* (2013.01); *H01L 29/66545* (2013.01); *H01L 29/66795* (2013.01); *H01L 29/785* (2013.01); *H01L 29/7848* (2013.01); *H01L 29/7851* (2013.01)

(56) References Cited

U.S. PATENT DOCUMENTS

| | | | |
|---|---|---|---|
| 7,795,097 | B2 | 9/2010 | Pas |
| 7,919,379 | B2 | 4/2011 | Cartier et al. |
| 8,278,179 | B2 | 10/2012 | Lin et al. |
| 8,310,013 | B2 | 11/2012 | Lin et al. |
| 8,383,503 | B2 | 2/2013 | Johnson |
| 8,445,334 | B1 | 5/2013 | Basker et al. |
| 8,741,701 | B2 | 6/2014 | Cheng et al. |
| 8,841,701 | B2 | 9/2014 | Lin et al. |
| 8,946,791 | B2 | 2/2015 | Basker et al. |
| 9,147,753 | B2 | 9/2015 | Colinge et al. |
| 9,455,331 | B1* | 9/2016 | Cai ................... H01L 29/6656 |
| 9,589,811 | B2 | 3/2017 | Ruffell |
| 9,627,410 | B2 | 4/2017 | Doris et al. |
| 2011/0133292 | A1* | 6/2011 | Lee ................ H01L 21/823431 257/401 |
| 2015/0076606 | A1 | 3/2015 | Cheng et al. |
| 2015/0091086 | A1 | 4/2015 | Lu et al. |
| 2015/0279975 | A1* | 10/2015 | Hsiao ................ H01L 29/66818 257/401 |
| 2016/0005868 | A1* | 1/2016 | Wei .................. H01L 29/66795 257/401 |
| 2016/0111542 | A1* | 4/2016 | Zhang ................ H01L 29/7851 257/401 |

OTHER PUBLICATIONS

T. Liow et al., "Spacer Removal Technique for Boosting Strain in n-Channel FinFETs With Silicon-Carbon Source and Drain Stressors," IEEE Electron Device Letters, Jan. 2008, pp. 80-82, vol. 29, No. 1.

Office Action issued in U.S. Appl. No. 15/792,146 dated Mar. 15, 2019, 16 pages.

Office Action issued in U.S. Appl. No. 15/792,146 dated Dec. 2, 2019, 16 pages.

* cited by examiner

COMPOSITE SPACER ENABLING UNIFORM DOPING IN RECESSED FIN DEVICES

BACKGROUND

Technical Field

The present disclosure relates to semiconductor devices, and more particularly to semiconductor devices including fin structures.

Description of the Related Art

With the continuing trend towards miniaturization of integrated circuits (ICs), there is a need for transistors to have higher drive currents with increasingly smaller dimensions. The use of non-planar semiconductor devices such as, for example, silicon fin field effect transistors (FinFETs) may be the next step in the evolution of complementary metal oxide semiconductor (CMOS) devices.

SUMMARY

In one embodiment, a method of forming a semiconductor device is provided that includes forming an inner spacer layer on source and drain portions of a fin structure and a gate structure that is present on the channel portion of the fin structure. An outer spacer layer is deposited on the inner spacer layer. An first etch process removes a portion of the outer spacer layer to expose a portion of the inner spacer layer that is present on an upper surface of the source and drain portions of the fin structure, wherein a remaining portion of the outer spacer layer is present overlying sidewalls of the lower surface of the source and drain portions of the fin structure. The inner spacer layer is removed selectively to the remaining portion of the outer spacer layer to exposed said sidewalls of the lower surface of the source and drain portions of the fin structure. Doped epitaxial semiconductor material is formed on the lower surface of the source and drain portions of the fin structures.

In another embodiment, a method of forming a semiconductor device is provided that includes forming a conformal inner spacer layer on source and drain portions of a fin structure and a gate structure that is present on the channel portion of the fin structure. A conformal outer spacer layer is deposited on the conformal inner spacer layer. An first etch process removes a portion of the outer layer to expose a portion of the inner spacer layer that is present on an upper surface of the source and drain portions of the fin structure, wherein a remaining portion of the outer spacer layer is present overlying sidewalls of the lower surface of the source and drain portions of the fin structure. The inner spacer layer is removed selectively to the remaining portion of the outer spacer layer to exposed said sidewalls of the lower surface of the source and drain portions of the fin structure. Doped epitaxial semiconductor material on the source and drain portions of the fin structures, wherein a first portion of the doped epitaxial semiconductor material is formed on the lower surface of the source and drain portions of the fin structures, and a second portion of the doped epitaxial semiconductor material has a substantially diamond shape and is formed on an upper surface of the source and drain portions of the fin structures.

In another aspect, a semiconductor device is provided that includes at least one fin structures, and a gate structure present on a channel portion of the fin structure. An epitaxial semiconductor material is present on at least one of a source region portion and a drain region portion on the fin structure, wherein the epitaxial semiconductor material includes a first portion having a substantially conformal thickness on a lower portion of the fin structure sidewall and a second portion having a substantially diamond shape that is present on an upper surface of said at least one of the source portion and drain portion of the fin structures. A spacer present on first portion of the epitaxial semiconductor material.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Figure 1:
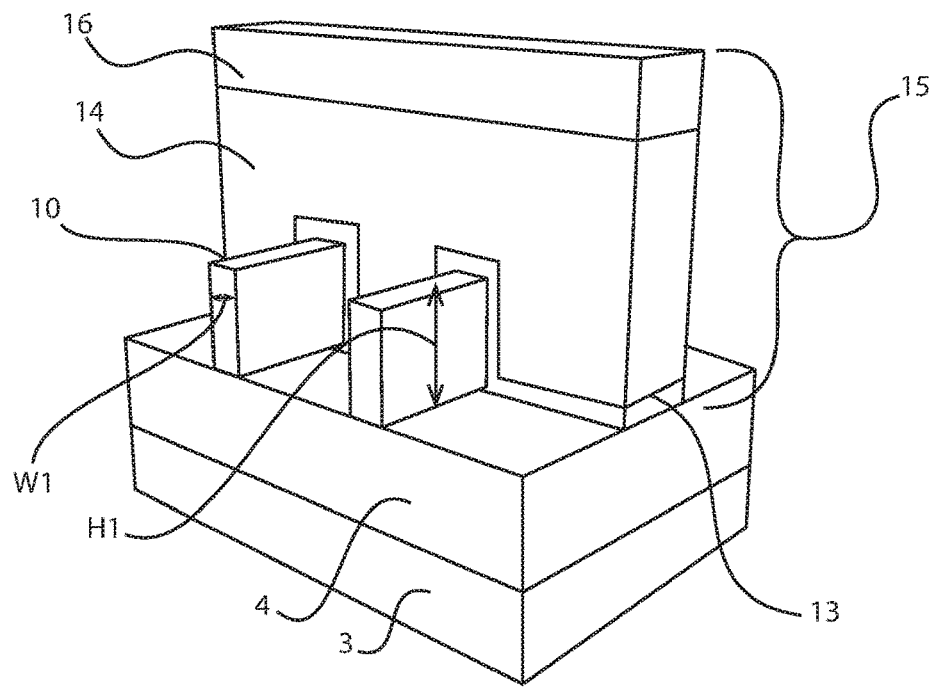
FIG. 1 is a perspective view depicting forming a gate structure on the channel region of a plurality of fin structures, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components.

Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The structures and methods that are disclosed herein provide a method for uniformly doping recessed fin structures, as used in fin-type field effect transistor (FinFET) semiconductor devices. As used herein, the term "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. A field effect transistor (FET) is a semiconductor device in which output current, i.e., source-drain current, is controlled by the voltage applied to a gate structure to the channel of a semiconductor device. A finFET is a semiconductor device that positions the channel region of the semiconductor device in a fin structure. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The source and drain regions of a finFET are typically formed on source and drain portions of the fin structures that are on opposing sides of the portion of the fin structure containing the channel region. In some examples, epitaxial semiconductor material provides portions of the source and drains regions of the FinFET, in which the epitaxial semiconductor material is formed on a portion of the source and drain portions of the fin structure.

As the fin height increases for high performance, it can be advantageous for spacer confined source and drain epitaxial material having an un-merged diamond like shape. For FinFETs formed on semiconductor on insulator (SOI) substrates, it has been determined that when employing epitaxial semiconductor material on an upper portion of the source and drain portions of the fin structures without doping a lower portion of the fin structures disadvantageously degrades the junction resistance of the device, i.e., results in a high junction resistance. Prior attempts to overcome this disadvantage include doping via ion implantation the lower portion of the fin structures prior to epitaxial growth, which results in high leakage effects due to dopant diffusion. The methods and structures disclosed herein employ a composite spacer to facilitate substantially uniform doping in recessed fin device, which in some embodiments can provide a performance benefit for FinFETs including tall fin heights. Further details regarding the method and structures of the present disclosure are now described with reference to FIGS. 1-7.

FIG. 1 depicts one embodiment of forming a gate structure 15 on the channel region of a plurality of fin structures 10. The semiconductor material that provides the fin structures 10 may be a semiconducting material including, but not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. The plurality of fin structures 10 may be formed from a semiconductor on insulator (SOI) substrate, or a bulk semiconductor substrate, using deposition photolithography and etch processes. In some embodiments, in which the fin structures 10 are formed from an SOI substrate, the fin structures 10 are formed from the SOI layer, i.e., the semiconductor layer that is present on the buried oxide (BOX) layer 4. In this example, the BOX layer 4 provides for isolation between adjacent fin structures 10, and the base semiconductor substrate 3, i.e., the semiconductor layer on the opposite face of the BOX layer 4 as the SOI layer, provides mechanical support.

In one embodiment, the patterning process used to define each of the fin structures 10 is a sidewall image transfer (SIT) process. The SIT process can include forming a mandrel material layer (not shown) on the material layer that provides the fin structures 10, such as the SOI layer of an SOI substrate, or the bulk semiconductor substrate upper surface. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 10, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 10.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structures 10, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structures 10. Following etching, i.e., pattern transfer, the SIT process may conclude with removing the dielectric spacers using an etch process or a planarization process.

It is noted that the aforementioned spacer image transfer (SIT) process is only one method of forming the fin structures 10. In another embodiment, each of the fin structures 10 may be formed using a photoresist etch mask. Specifically, in one example, a photoresist mask is formed overlying the semiconductor composition layer which provides the fin structures 10. The exposed portions of the semiconductor layer that provides the fin structures 10 that are not protected by the photoresist mask are removed using a selective etch process. To provide the photoresist mask, a photoresist layer is first positioned on the semiconductor layer that provides the fin structure 10, e.g., SOI layer of an SOI substrate or upper surface of bulk semiconductor substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structures 10. The etch process may be an anisotropic process, such as reactive ion etch (RIE).

Each of the fin structures 10 may have a height Hi ranging from 5 nm to 200 nm. In another embodiment, each of the fin structures 10 has a height Hi ranging from 10 nm to 100 nm. In one example, each of the fin structures 10 has a height Hi ranging from 20 nm to 50 nm. Each of the plurality of fin structures 10 may have a width $W_1$ of less than 20 nm. In another embodiment, each of the fin structures 10 has a width $W_1$ ranging from 3 nm to 8 nm. Although two fin structures 10 are depicted in FIG. 1, the present disclosure is not limited to only this example. It is noted that any number of fin structures 10 may be formed from the SOI substrate. The pitch P1 separating adjacent fin structures 10 may range from 35 nm to 45 nm. In another example, the pitch P1 separating adjacent fin structures 10 may range from 30 nm to 40 nm.

FIG. 1 further depicts forming a gate structure 15 on the channel portion of the fin structures 10. The "gate structure" functions to switch the semiconductor device from an "on" to "off" state, and vice versa. The gates structure 15 is formed on the channel region of the fin structures 10. The gate structure 15 typically includes at least a gate dielectric 13 that is present on the channel region of the fin structure 10, and a gate electrode 14 that is present on the gate dielectric 13. In one embodiment, the at least one gate dielectric layer 13 includes, but is not limited to, an oxide, nitride, oxynitride and/or silicates including metal silicates, aluminates, titanates and nitrides. In one example, when the at least one gate dielectric layer 13 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 13 may vary, but typically, the at least one gate dielectric layer 13 has a thickness from 1 nm to 10 nm. In another embodiment, the at least one gate dielectric layer 13 has a thickness from 1 nm to 3 nm.

The conductive material of the gate electrode 14 may comprise polysilicon, SiGe, a silicide, a metal or a metal-silicon-nitride such as Ta—Si—N. Examples of metals that can be used as the gate electrode 14 include, but are not limited to, Al, W, Cu, and Ti or other like conductive metals. The layer of conductive material for the gate electrode 14 may be doped or undoped. If doped, an in-situ doping deposition process may be employed. Alternatively, a doped conductive material can be formed by deposition, ion implantation and annealing.

The gate structure 15 may be formed by using a deposition method, such as a chemical vapor deposition method and/or a physical vapor deposition (PVD), to deposit the material layers for the at least one gate dielectric layer and the at least one gate electrode followed by photolithography and etch processing. In some embodiments, a hardmask 16 may be formed on the upper surface of the material layer for the gate electrode 14 as part of the photolithography and etch processing used to define the geometry of the gate structure 15. The hardmask 16 may be composed of a nitride, oxide, or oxynitride material.

Figure 2:
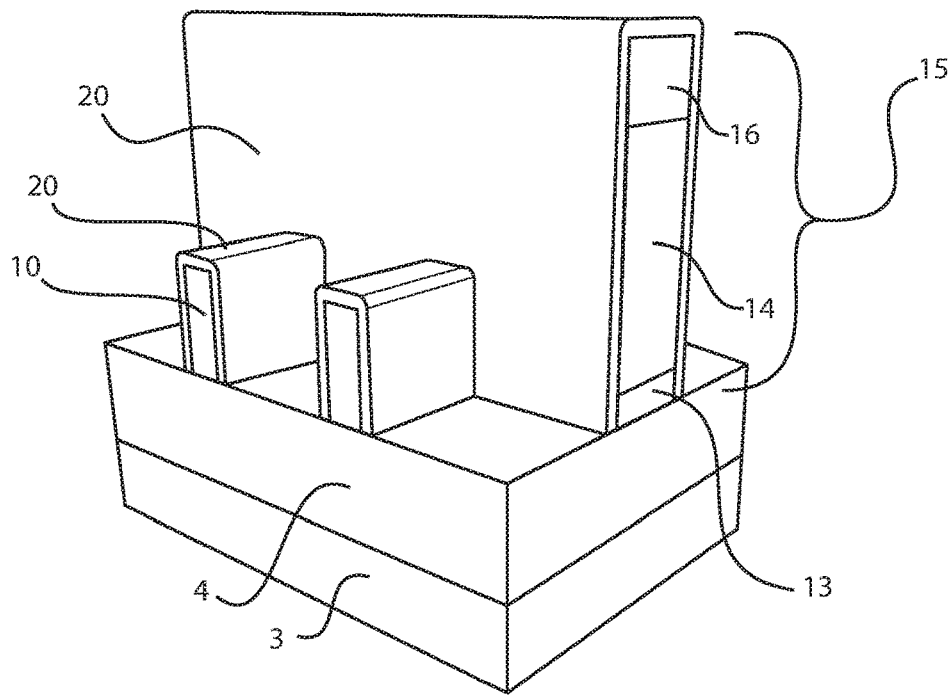
FIG. 2 is a perspective view depicting forming an inner spacer layer on source and drain portions of a fin structure and a gate structure that is present on the channel portion of the fin structure, in accordance with one embodiment of the present disclosure.

FIG. 2 depicts one embodiment of forming an inner spacer layer 20 (also referred to as first spacer layer) on source and drain portions of the fin structure 10, and forming the inner spacer layer 20 on the gate structure 15 that is present on the channel portion of the fin structure 10. The inner spacer layer 20 may be blanket deposited atop the structure depicted in FIG. 1, including being formed over the exposed portions of the upper surface of the substrate, i.e., exposed surfaces of the BOX layer 4. The inner spacer layer 20 may be a conformal layer (also referred to as a conformally deposited layer). The term "conformal" denotes a layer having a thickness that does not deviate from greater than or less than 30% of an average value for the thickness of the layer. The inner spacer layer 20 may be composed of any dielectric material, such as an oxide containing dielectric, e.g., silicon oxide ($SiO_2$); a nitrogen containing dielectric, e.g., silicon nitride; or a combination thereof, such as silicon oxynitride. It is noted that the above compositions for the inner spacer layer 20 are provided for illustrative purposes only, and are not intended to limit the present disclosure.

The inner spacer layer 20 may be deposited using a conformal dielectric process. For example, the inner spacer layer 20 may be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In one embodiment, the thickness of the inner spacer layer 20 may ranges from 1 nm to 10 nm. In another embodiment, the thickness of the inner spacer layer 20 may range from 3 nm to 5 nm. In one preferred embodiment, the inner spacer layer 20 is composed of silicon oxide ($SiO_2$) having a thickness ranging from 3 nm to 5 nm.

Figure 3:
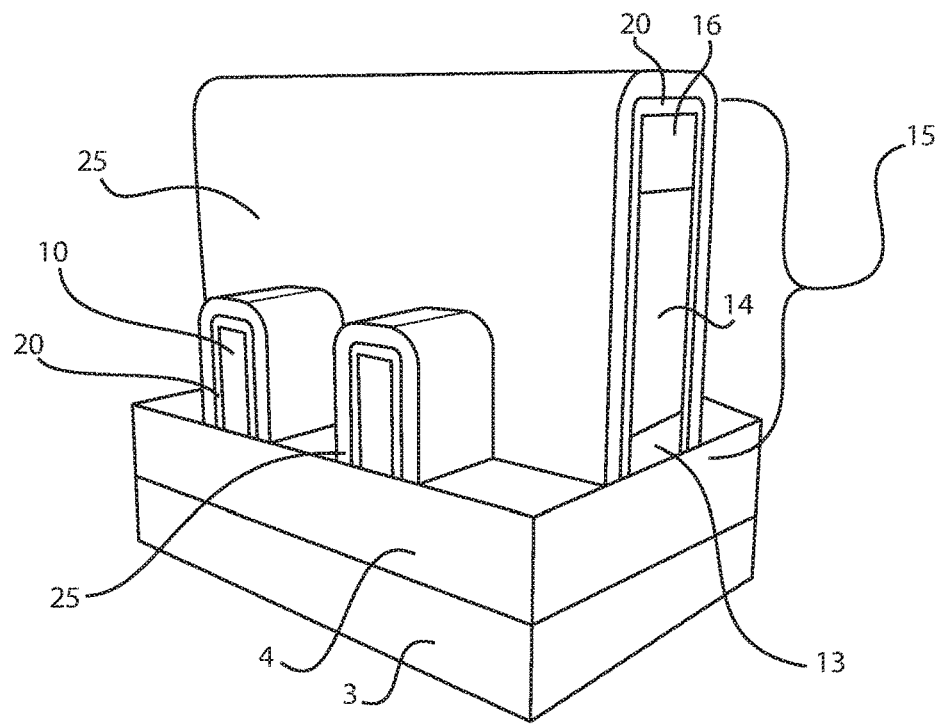
FIG. 3 is a perspective view depicting forming an outer spacer layer on the inner spacer layer, in accordance with one embodiment of the present disclosure.

FIG. 3 depicts forming an outer spacer layer 25 on the inner spacer layer 20. Similar to the inner spacer layer 20, the outer spacer layer 25 may be a conformally deposited layer. The outer spacer layer 25 is typically blanket deposited on the inner spacer layer 20. The outer spacer layer 25 is typically composed of a dielectric material that can be etched selectively to the inner spacer layer 20. The compositions for inner spacer layer 20 and the outer spacer layer 25 are typically selected to provide for selective etching with respect to one another during the following described process sequence. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater.

In some embodiments, the outer spacer layer 25 is typically composed of a low-k dielectric material. A low-k dielectric material may have a dielectric constant that is less than 4.0, e.g., 3.9. In one embodiment, the low-k material that provides the outer spacer layer 25 may have a dielectric constant ranging from 1.0 to 3.5. In another embodiment, the low-k material that provides the outer spacer layer 25 may have a dielectric constant ranging from 1.75 to 3.2.

Examples of materials suitable for the low-k materials for the outer spacer layer 25 may include silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC) and combinations thereof. In some embodiments, the outer spacer layer 20 may be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In other embodiments, the outer spacer layer 25 may be composed of a low-k dielectric material that can include spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

In some embodiments, the outer spacer layer 25 is deposited to a thickness greater than the inner spacer layer 20. For example, in some embodiments, the outer spacer layer 25 may have a thickness ranging from 5 nm to 30 nm. In another embodiment, the outer spacer layer 25 may have a thickness ranging from 7 nm to 15 nm. In one example, the outer spacer layer 25 is composed of silicon carbon boron nitride (SiCBN) or silicon oxycarbonitride (SiOCN) having a thickness of approximately 10 nm, e.g., 9 nm.

It is noted that the above examples of the material compositions for the outer spacer layer 25 and the inner spacer layer 20 are provided for illustrative purposes only, and are not intended to limit the present disclosure. For example, the material compositions for the outer spacer layer 25 and the inner spacer layer 20 may also be selected from hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_2O_3$), lanthanum aluminate ($LaAlO_3$), zirconium silicate ($ZrSiO_x$) and combinations thereof, so long as the material combinations selected provide for etch selectivity in accordance with the following described process flow.

Figure 4:
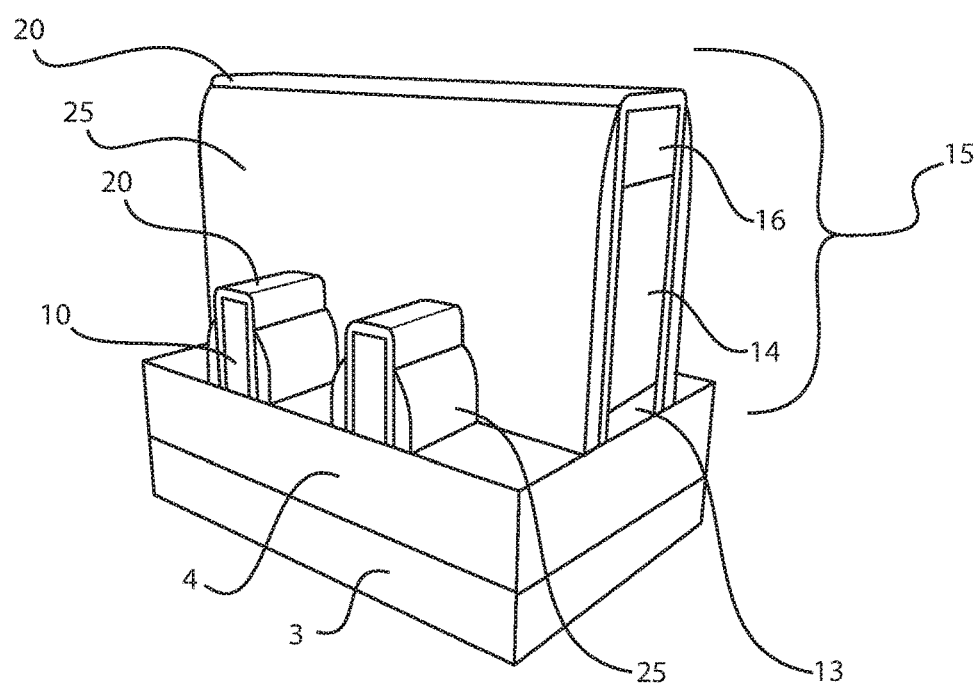
FIG. 4 is a perspective view depicting a first etch process to remove a portion of the outer layer to expose a portion of the inner spacer layer that is present on an upper surface of the source and drain portions of the fin structure, wherein a remaining portion of the outer spacer layer is present overlying sidewalls of the lower surface of the source and drain portions of the fin structure, in accordance with one embodiment of the present disclosure.

FIG. 4 depicts a first etch process to remove a portion of the outer spacer layer 25 to expose a portion of the inner spacer layer 20 that is present on an upper surface of the source and drain portions of the fin structure 10. In some embodiments, a remaining portion of the outer spacer layer 25 is present overlying sidewalls of the lower surface of the source and drain portions of the fin structure 10. In some embodiments, the first etch process includes an anisotropic etch. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

In some embodiments, the first etch process for removing the outer semiconductor layer 25 may be selected to the inner semiconductor layer 20. In some embodiments, the etch process for etching the outer spacer layer 25 is a timed etch or employs end point detection to determine when the etch process is to be terminated. In the embodiment that is depicted in FIG. 2, the etch process may continue until the portions of the outer spacer layer 25 is removed from the upper surface of the fin structure to expose the portion of the inner spacer 20 that is present on the upper surfaces, i.e., sidewall and top surface, of the source and drain portions of the fin structure 10. The first etch process may also remove the portion of the outer spacer layer 25 from the upper surface of the gate structure 15, in which a portion of the outer spacer layer 25 remains on the sidewall surface of the gate structure 15, as depicted in FIG. 4. The outer spacer layer 25 may provide a portion of a gate sidewall spacer.

In some embodiments, the remaining portion of the outer spacer layer 25 that is present on the inner spacer layer 20 that is present on the sidewalls of the source and drain portions of the fin structure 10 may be present on the lower ¾ of the height of the fin structure. In another embodiment, the remaining portion of the outer spacer layer 25 that is present on the inner spacer layer 20 that is present on the sidewalls of the source and drain portions of the fin structure 10 may be present on the lower ½ of the height of the fin structure. In yet another embodiment, the remaining portion of the outer spacer layer 25 that is present on the inner spacer layer 20 that is present on the sidewalls of the source and drain portions of the fin structure 10 may be present on the lower ½ of the height of the fin structure 10.

Figure 5:
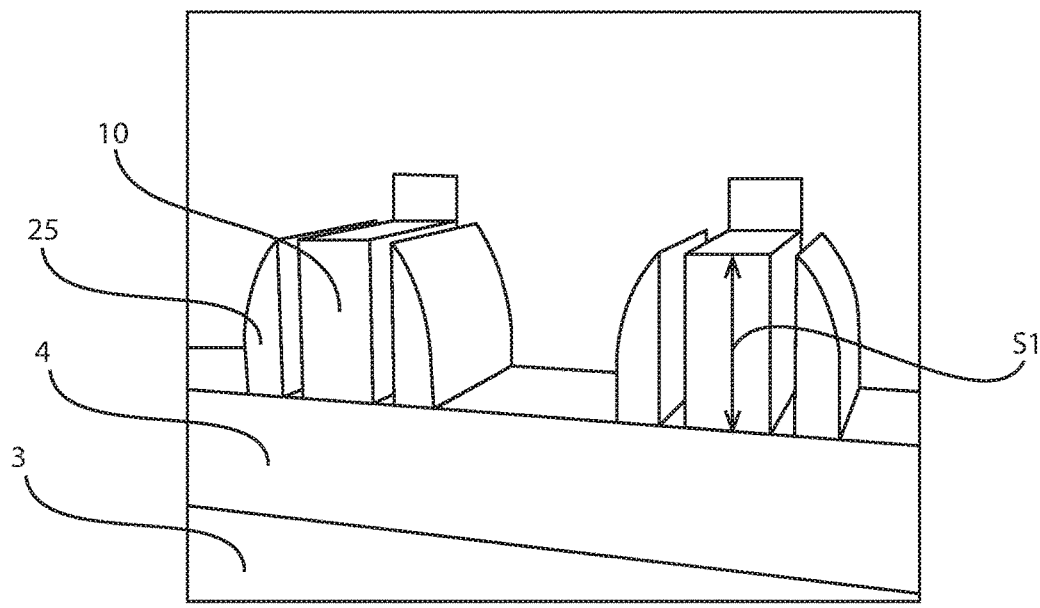
FIG. 5 is a perspective view depicting removing the inner spacer layer selectively to the remaining portion of the outer spacer layer to exposed said sidewalls of the lower surface of the source and drain portions of the fin structure, in accordance with one embodiment of the present disclosure.

FIG. 5 depicts removing the inner spacer layer 20 selectively to the remaining portion of the outer spacer layer 25 to exposed said sidewalls S1 of the lower surface of the source and drain portions of the fin structure 10. The inner spacer layer 20 may be removed by a second etch process, which may also be an anisotropic etch, such as reactive ion etch, laser etching or anisotropic plasma etching. In other embodiments, the inner spacer layer 20 may be removed by an etch process that is isotropic. By isotropic it is meant that the etch process is non-directional. In one embodiment, the isotropic etch that removes the inner spacer layer 20 may be plasma etch or wet chemical etch.

In some embodiments, removing the inner spacer layer 20 forms a trench between the sidewall of the fin structure 10 and the remaining portion of the outer spacer layer 25 that is present on the sidewalls of the source and drain region portions of the fin structure 10. In some embodiments, removing the inner spacer layer 20 may also recess a portion of the source and drain region portions of the fin structure 10. It is noted that recessing the upper surface of the fin structure 10 is optional, and may be omitted.

In one embodiments, in which the inner spacer layer 20 is composed of silicon oxide ($SiO_2$) and the outer spacer layer 25 is composed of silicon carbon boron nitride (SiCBN) or silicon oxycarbonitride (SiOCN), the etch process for removing the inner spacer layer 20 selectively to the remaining portion of the outer spacer layer 25 may include a buffered HF (BHF) composition. In some embodiments, BHF is a wet etchant that is a mixture of a buffering agent, such as ammonium fluoride ($NH_4F$) and hydrofluoric acid (HF). The inner spacer layer 20 may also be removed by RIE.

Figure 6:
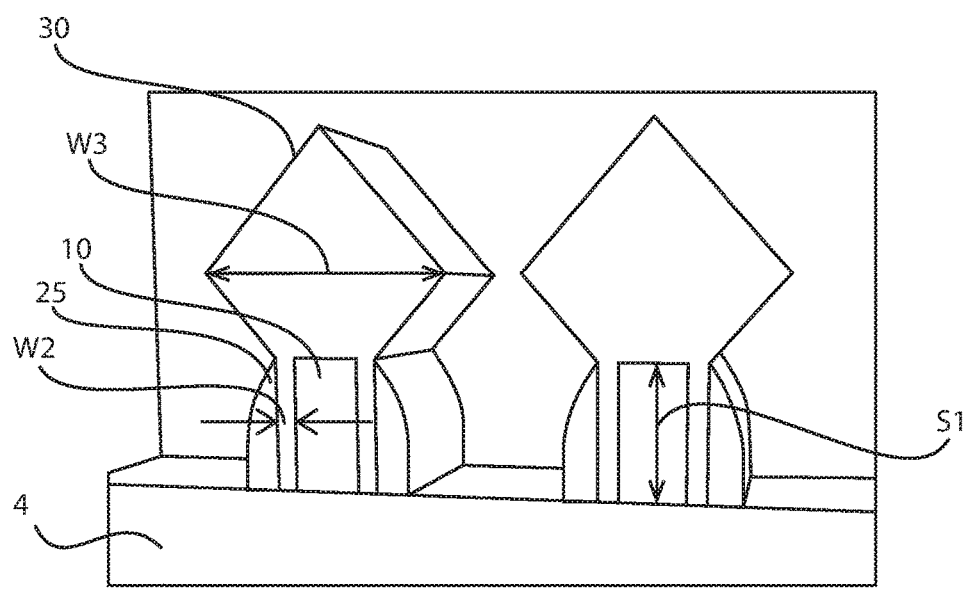
FIG. 6 is a perspective view depicting forming doped epitaxial semiconductor material on the lower surface of the source and drain portions of the fin structures, in accordance with one embodiment of the present disclosure.

FIG. 6 depicts forming doped epitaxial semiconductor material 30 on the lower surface of the source and drain portions of the fin structures 10. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The epitaxial material 30 formed on the fin structures of Fin Field Effect Transistors (FinFET) may provide a component of the source and drain regions of the FinFET. In this example, the epitaxial semiconductor material 30 may be formed on the source and drain region portions of the fin structures 10, which are on opposing sides of the channel portion of the fin structure 10 that the gate structure 15 is present on.

In some embodiments, the epitaxial semiconductor material 30 is formed on the sidewalls Si of the lower portion of the fin structures 10 filling the trench that is formed by removing the inner spacer layer 20, and the epitaxial semiconductor material 20 is formed on the upper portion, i.e., upper surface, of the fin structures 10.

The epitaxial semiconductor material 30 is typically epitaxially grown/deposited. In some embodiments, epitaxial deposition of the undoped epitaxial semiconductor material 30 is a selective deposition process. For example, although the epitaxial semiconductor material 30a, 30b orientates to the crystal arrangement of a semiconductor material and is deposited thereon, such as the exposed sidewall surfaces Si and upper surfaces of the fin structures 10, the epitaxial semiconductor material 30 may not be directly deposited on a dielectric material, such as the outer sidewall layer 25.

The epitaxial semiconductor material 30 is initially deposited on exposed semiconductor surfaces of the fin structures 10, and grows from those surfaces with increasing deposition time. The deposition time is selected so that the epitaxial semiconductor material 30 that is formed on adjacent fin structures 10 does not merge, as depicted in FIG. 6. Epitaxial semiconductor material 30 that is formed on adjacent fin structure and remains separate, i.e., not merged, may be referred to as "non-merged epitaxial semiconductor material 30.

In some embodiments, the epitaxial semiconductor material 30 may be composed of silicon (Si), germanium (Ge), silicon germanium (SiGe), silicon doped with carbon (Si:C) or the epitaxial semiconductor material 30 may be composed of a type III-V compound semiconductor, such as gallium arsenide (GaAs). For example, when the semiconductor device, e.g., FinFETs, being formed are p-type and the fin structures 10, 10 are composed of silicon (Si), the source and drain regions may be doped to a p-type conductivity, and the material of the epitaxial semiconductor material 30 may be a germanium containing material, such as silicon germanium (SiGe). In other examples, when the semiconductor device, e.g., FinFETs, being formed are n-type and the fin structures 10 are composed of silicon (Si), the source and drain regions may be doped to an n-type conductivity, and the material of the epitaxial semiconductor material 30 may be silicon (Si) or silicon doped with carbon (Si:C).

In one embodiment, a number of different sources may be used for the epitaxial deposition of the epitaxial semiconductor material 30a, 30b. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming an undoped epitaxial semiconductor material 6a, 6b of a germanium containing semiconductor include germane, digermane, halogermane, dichlorogermane, trichlorogermane, tetrachlorogermane and combinations thereof.

Epitaxial deposition may be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition may result in crystal defects and film cracking. In one embodiment, the thickness of epitaxial semiconductor material 30 may range from 10 nm to 100 nm In another embodiment, the thickness of epitaxial semiconductor material 30 may range from 40 nm to 60 nm.

The epitaxial semiconductor material 30 may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses.

In the embodiments in which the finFET device being formed has n-type source and drain regions, and is referred to as an n-type finFET, the doped epitaxial semiconductor material 30 is doped with an n-type dopant to have an n-type conductivity. In the embodiments in which the finFET device being formed has p-type source and drain regions, and is referred to as a p-type finFET, the doped epitaxial semiconductor material 30 is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). The p-type gas dopant source may include diborane ($B_2H_6$).

In some embodiments, the n-type or p-type dopant may be present in the doped epitaxial semiconductor material 30 in a concentration ranging from $1\times10^{17}$ to $1\times10^{21}$ atoms/cm$^3$. In another embodiment, the n-type or p-type dopant may be present in the doped epitaxial semiconductor material 30 in a concentration ranging from $1\times10^{18}$ to $1\times10^{20}$ atoms/cm$^3$.

In some embodiments, the doped epitaxial semiconductor material 30 on the source and drain portions of the fin structures 10 includes a first portion formed on the lower surface, sidewall Si, of the source and drain portions of the fin structures that is substantially conformal in width W2. In one embodiment, the width W2 of the first portion of the doped epitaxial semiconductor material 30 may range from 1 nm to 10 nm. In another embodiment, the width W2 of the first portion of the doped epitaxial semiconductor material 30 ranges from 3 nm to 5 nm. A second portion of the doped epitaxial semiconductor material 30 can have a substantially diamond shape and is formed on an upper surface of the source and drain portions of the fin structures 10. The second portion of the epitaxial semiconductor material 30 having the substantially diamond shape may increase in width from the upper surface of the fin structures to its maximum width W3. The maximum width W2 of the second portion of the epitaxial semiconductor material 30 having the substantially diamond shape may range from 5 nm to 50 nm. In some embodiments, the maximum width W2 of the second portion of the epitaxial semiconductor material 30 having the substantially diamond shape may range from 10 nm to 30 nm. The upper portion of the diamond shape for the second portion of the doped epitaxial semiconductor material 30 decreases in width until reaching an apex that is substantially centrally positioned over a center of a width W1 of the source and drain portions of the fin structure 10. It is noted that the above dimensions for the widths of the first and second portions of the epitaxial semiconductor material 30 have been provided for illustrative purposes only, and are not intended to limit the present disclosure solely thereto.

In one embodiment, dopant from the doped epitaxial semiconductor material 30 is diffused into the fin structures 5 to form extension dopant regions. In some embodiments, the diffusion, i.e., driving, of the dopant from the doped epitaxial semiconductor material 30 into the extension region portions of the fin structures 10 comprises thermal annealing. In one embodiment, the thermal annealing that diffuses the dopant from the doped epitaxial semiconductor material 30 into the extension region portions of the fin structures 10 includes an annealing process selected from the group consisting of rapid thermal annealing (RTA), flash lamp annealing, furnace annealing, laser annealing and combinations thereof. In one embodiment, the thermal annealing for driving the dopant, i.e., p-type or n-type dopant, from doped epitaxial semiconductor material 30 into the extension region portions of the fin structures 10 may include a temperature ranging from 800° C. to 1200° C., and a time period ranging from 10 milliseconds to 100 seconds.

In some embodiments, because the epitaxial semiconductor material 30 extends along an entirety of the sidewall Si of the source and drain portions of the fin structures 10, the dopant that is diffused from the epitaxial semiconductor material 30 into the fin structure 10 is diffused in a relatively uniform manner throughout the entire height of the source and drain portions of the fin structures 10. This removes the non-doped region at the lower half of fin structure that results from prior methods that do not include the composite spacer and epitaxial semiconductor material of the present disclosure. For example, the dopant for the source and drain region of the FinFET, e.g., n-type or p-type dopant, that is diffused into the source and drain region portions of the fin structure may be present in a concentration ranging from $1\times10^{17}$ to $1\times10^{21}$ atoms/cm$^3$. In another embodiment, the n-type or p-type dopant may be present in the source and drain region portions of the fin structure 10 in a concentration ranging from $1\times10^{18}$ to $9\times10^{20}$ atoms/cm$^3$. In some embodiments, the dopant concentration at the base of the source and drain portions of the fin structure 10, which interfaces with the supporting substrate 3, is substantially the same as the dopant concentration at the upper surface of the source and drain portions of the fin structure 10 with an variation of less than 2×.

Figure 7:
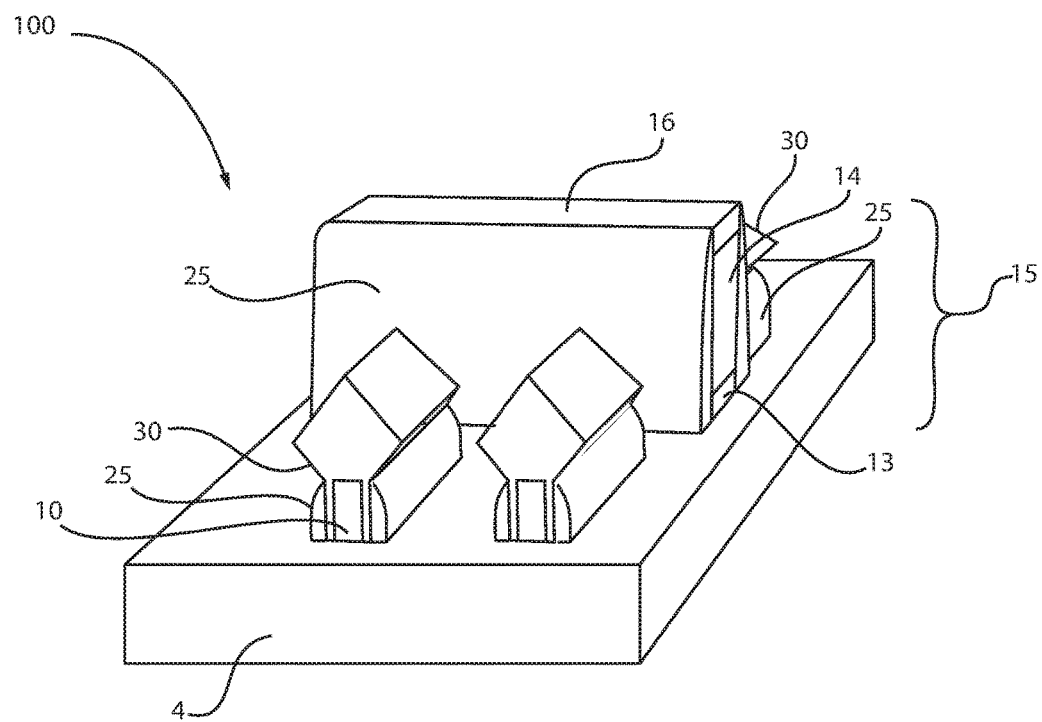
FIG. 7 is a perspective view of a Fin type Field Effect Transistor (FinFET) including source and drain portions having epitaxial semiconductor material that includes a first portion having a substantially conformal thickness on a lower portion of the fin structure sidewall and a second portion having a substantially diamond shape that is present on an upper surface of the fin structure sidewall, in accordance with one embodiment of the present disclosure.

FIG. 7 depicts one embodiment of Fin type Field Effect Transistor (FinFET) 100 including source and drain portions having epitaxial semiconductor material 30 that includes a first portion having a substantially conformal thickness on a lower portion of the fin structure sidewall and a second portion having a substantially diamond shape that is present on an upper surface of the fin structure sidewall. In FIG. 7 only one of the source and drain region are depicted as the opposite of the depicted source or drain region is present on the opposite side of the gate structure 15 obstructed from being viewed from the view presented in FIG. 7.

It is noted that the above process sequence describes a gate first process sequence for forming FinFETs. The present disclosure is not limited to only gate first processing. For example, gate last, which is also referred to as replacement gate processing, is also suitable for use with the methods and structures of the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

The methods and structures that have been described above with reference to FIGS. 1-7 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device comprising:
a plurality of fin structures;
an epitaxial semiconductor material on at least one of a source region portion and a drain region portion of at least two fin structures that are adjacent in the plurality of fin structures, wherein the epitaxial semiconductor material on each of the at least two fin structures includes a first portion having a uniform thickness on a fin structure sidewall of the source portion and the drain portion of the fin structure and a second portion having a diamond shape that is in direct contact with an upper surface of the source portion and the drain portion of the fin structure, wherein the epitaxial semiconductor material on a first of the fin structures that are adjacent does not contact the epitaxial semiconductor material on a second of the fin structures, the epitaxial semiconductor material being doped to an n-type or p-type dopant that has a substantially uniform concentration along a height of the source and drain portions of the fin structure; and
spacers in direct contact with an entirety of a sidewall of the first portion of the epitaxial semiconductor material.

2. The semiconductor device of claim 1, wherein the spacer comprises a low-k dielectric material.

3. A semiconductor device comprising;
a plurality of fin structures;
a gate structure present on a channel portion of each of the plurality of fin structures;
an epitaxial semiconductor material on at least one of a source region portion and a drain region portion of the at least two fin structures that are adjacent in the plurality of fin structures, wherein the epitaxial semiconductor material includes a first portion having a uniform thickness on a fin structure sidewall of the source portion and the drain portion of the fin structures, and a second portion having a diamond shape that is in direct contact with an upper surface of the source portion and the drain portion of the fin structures, wherein the epitaxial semiconductor material on a first of the fin structures that are adjacent does not contact the epitaxial semiconductor material on a second of the fin structures, the epitaxial semiconductor being doped to an n-type or p-type dopant that has a substantially uniform concentration along a height of the source and drain portion of the fin structure; and
a spacer present on first portion of the epitaxial semiconductor material, wherein the first portion of the epitaxial semiconductor material is positioned between the spacer and a fin structure for each fin structure in said plurality of fin structures.

4. The semiconductor device of claim 3, wherein the spacer comprises a low-k dielectric material.

5. A semiconductor device comprising;
an epitaxial semiconductor material on at least one of a source region portion and a drain region portion of the at least one fin structure, wherein the epitaxial semiconductor material includes a first portion on a lower portion of the fin structure sidewall and a second portion having a diamond shape that is present on an upper surface of said at least one of the source portion and drain portion of the fin structures, the epitaxial semiconductor being doped to an n-type or p-type dopant that has a substantially uniform composition along a height of the source and drain portions of the fin structure; and
a spacer present on first portion of the epitaxial semiconductor material, the first portion of the epitaxial semiconductor material positioned between the spacer and the fin structure sidewall to provide that the first portion of the epitaxial semiconductor material has a uniform width.

6. The semiconductor device of claim 5, wherein the epitaxial semiconductor material in non-merged epitaxial semiconductor material.

7. The semiconductor device of claim 5, wherein the spacer is present on half a height of the fin structure or less.

8. The semiconductor device of claim 5, wherein the spacer comprises a low-k dielectric material.

* * * * *